(12) United States Patent
Augur

(10) Patent No.: US 8,349,734 B2
(45) Date of Patent: Jan. 8, 2013

(54) INTEGRATED CIRCUITS HAVING BACKSIDE TEST STRUCTURES AND METHODS FOR THE FABRICATION THEREOF

(75) Inventor: Roderick Augur, Hopewell Junction, NY (US)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 204 days.

(21) Appl. No.: 12/755,983

(22) Filed: Apr. 7, 2010

(65) Prior Publication Data
US 2011/0248263 A1    Oct. 13, 2011

(51) Int. Cl.
*H01L 21/44* (2006.01)
*H01L 29/40* (2006.01)

(52) U.S. Cl. .............. 438/667; 257/621; 257/E21.597; 257/E23.011

(58) Field of Classification Search ............ 257/618, 257/621, 678, 690, 698, E21.001, E21.532, 257/E21.536, E21.575, E21.597, E23.001, 257/E23.01, E23.011; 438/584, 597, 666, 667

See application file for complete search history.

(56) References Cited

U.S. PATENT DOCUMENTS

| | | | | |
|---|---|---|---|---|
| 3,765,969 A | * | 10/1973 | Kragness et al. | 438/753 |
| 6,114,240 A | * | 9/2000 | Akram et al. | 438/667 |
| 6,198,168 B1 | * | 3/2001 | Geusic et al. | 257/774 |
| 2004/0225821 A1 | * | 11/2004 | Klein et al. | 710/306 |
| 2005/0064707 A1 | * | 3/2005 | Sinha | 438/667 |
| 2006/0109017 A1 | * | 5/2006 | Kim et al. | 324/754 |

* cited by examiner

*Primary Examiner* — Ha Tran T Nguyen
*Assistant Examiner* — Kevin Quinto
(74) *Attorney, Agent, or Firm* — Ingrassia Fisher & Lorenz, P.C.

(57) ABSTRACT

Embodiments of a method for fabricating an integrated circuit having a backside test structure are provided. In one embodiment, the method includes the steps of providing a semiconductor substrate, forming at least one Through-Silicon-Via (TSV) through the semiconductor substrate, forming a backside probe pad over the backside of the semiconductor substrate and electrically coupled to the at least one TSV, and forming a frontside bondpad over the frontside of the semiconductor substrate. The frontside bondpad is electrically coupled to the backside probe pad by the at least one TSV.

16 Claims, 6 Drawing Sheets

US 8,349,734 B2

INTEGRATED CIRCUITS HAVING BACKSIDE TEST STRUCTURES AND METHODS FOR THE FABRICATION THEREOF

TECHNICAL FIELD

The present invention relates generally to semiconductor devices and, more particularly, to integrated circuits having backside test structures, as well as to methods for forming such integrated circuits.

BACKGROUND

During front end-of-the-line processing, a plurality of semiconductor devices (e.g., transistors, resistors, capacitors, and the like) is formed on a semiconductor wafer. During back end-of-the-line (BEOL) processing, the semiconductor devices are interconnected to form a plurality of integrated circuits on the wafer, which are subsequently separated into individual die during wafer dicing. Interconnection of the semiconductor devices is accomplished via the formation of a plurality of BEOL layers, which include successively-deposited metallization and intermetal dielectric layers. Relatively large (e.g., >50 microns) metal pads are typically formed in the BEOL layers during back end-of-the-line processing to permit inline testing of device functionality, switching speed, and various other electrical characteristics of the fully or partially completed circuit (e.g., metallization layer resistance, leakage between closely-spaced lines, etc.). By industry convention, the metal pads formed in the BEOL layers are commonly referred to as "bondpads," whether or not the pads are actually utilized for bonding. In the case of production wafers, the bondpads are typically disposed within the wafer's saw lanes so as not to detract from the area available for active devices. During inline testing, electrical measurements are performed utilizing an electrical testing apparatus or "prober," which often includes a probe card carrying multiple cantilevered needles. During each inline testing event, the cantilevered probe needles are placed in contact with the exposed bondpads and electrical measurements are then taken.

To ensure adequate electrical contact during inline testing, probe needles are typically pressed against the bondpads with sufficient force to cause needle deflection. During touch down, the probe needle can scratch or gouge the upper contact surface of the tested bondpad, which may result in the pile-up of bondpad material (e.g., copper) on the bondpad's contact surface. Pile-up of the bondpad material can prevent the subsequently-deposited interlayer dielectric from forming a complete seal over the bondpad, which, in turn, may result in the formation of one or more ingress paths through which water may seep during subsequent processing steps (e.g., wafer wet clean). Residual water can react with and oxidize the metal liner subsequently deposited over the sidewalls of contact openings and trenches, thereby decreasing the effectiveness of the metal liner as a barrier to conductive (e.g., copper) plugs later formed within contact openings. In addition, residual water can upset the etching process (e.g., reactive ion etching) utilized to pattern the interlay dielectric deposited over the scratched bondpad. The ingress of water due to bondpad gouging is thus problematic for test wafers, as it can compromise the semiconductor devices tested in a prior metallization level. The ingress of water is also problematic for production wafers; even when the bondpads are formed in the production wafer's saw lanes, residual water can diffuse significant distances within the interlayer dielectric and potentially reach the active areas of the circuit. Diffusion of residual water is especially problematic for production wafers employing ultra low-k ("ULK") dielectrics, which often have relatively high porosities that promote the widespread wicking of residual water through the ULK dielectric.

Considering the above, it would be desirable to provide embodiments of a method for fabricating an integrated circuit wherein the likelihood of bondpad gouging, and thus the likelihood of residual water ingress, is significantly reduced or eliminated. Ideally, embodiments of such integrated circuit fabrication method would be compatible with ULK dielectrics and would minimize production costs by utilizing fabrication techniques already incorporated within mainstream circuit production or likely to be incorporated into mainstream circuit production in the near future. It would also be desirable to provide embodiments of an integrated circuit that can be produced utilizing such a circuit fabrication method and that includes unique structural means for avoiding frontside bondpad gouging. Other desirable features and characteristics of the present invention will become apparent from the subsequent detailed description and the appended Claims, taken in conjunction with the accompanying Drawings and the foregoing Technical Field and Background.

BRIEF SUMMARY

Embodiments of a method for fabricating an integrated circuit having a backside test structure are provided. In one embodiment, the method includes the steps of providing a semiconductor substrate, forming at least one Through-Silicon-Via (TSV) through the semiconductor substrate, forming a backside probe pad over the backside of the semiconductor substrate and electrically coupled to the at least one TSV, and forming a frontside bondpad over the frontside of the semiconductor substrate. The frontside bondpad is electrically coupled to the backside probe pad by the at least one TSV.

Embodiments of an integrated circuit are also provided. In one embodiment, the integrated circuit includes a semiconductor substrate, a backside probe pad formed over the backside of the semiconductor, a frontside bondpad formed over the frontside of the semiconductor substrate, and at least one TSV extending through the semiconductor substrate. The at least one TSV electrically couples the backside probe pad to the frontside bondpad.

BRIEF DESCRIPTION OF THE DRAWINGS

The present invention will hereinafter be described in conjunction with the following drawing figures, wherein like numerals denote like elements, and wherein.

DETAILED DESCRIPTION

The following Detailed Description is merely exemplary in nature and is not intended to limit the invention or the application and uses of the invention. Furthermore, there is no intention to be bound by any expressed or implied theory presented in the preceding Technical Field, Background, Brief Summary, or the following Detailed Description. As appearing herein, the term "over" is utilized to indicate relative position between two structural elements and not necessarily to denote physical contact between structural elements. Certain terminology may appear in the following Detailed Description for the purpose of reference only and is not intended to be limiting. For example, terms such as "upper," "lower," "above," and "below" refer to directions in the subsequently-referenced Drawings. These and similar terms may be utilized herein to describe the orientation and/or location of a feature or element within a consistent but arbitrary frame of reference, which is made clear by reference to the text and the associated Drawings describing the component, device, and/or process under discussion.

Figure 1:
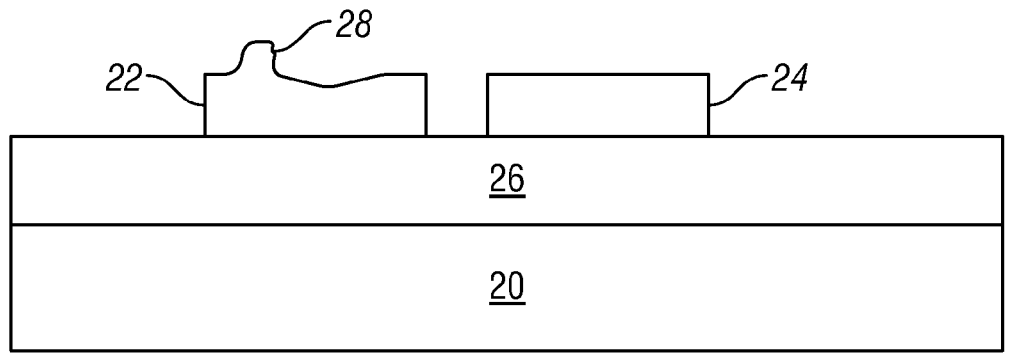
FIG. 1 is a simplified cross-sectional view of an integrated circuit (partially completed) illustrating bondpad gouging that can occur during inline testing in accordance with the teaching of prior art.

FIG. 1 is a simplified cross-sectional view of a semiconductor substrate 20 (partially shown) having first and second frontside bondpads 22 and 24 formed thereon in accordance with the teachings of prior art. Frontside bondpads 22 and 24 are electrically coupled to a plurality of semiconductor devices formed over semiconductor substrate 20 (generically illustrated in FIG. 1 at 26). As indicated in the foregoing section entitled "Background," frontside bondpads 22 and 24 permit inline testing of the functionality, switching speed, and various other electrical characteristics (e.g., metallization layer resistance, leakage between closely-spaced lines, etc.) of semiconductor devices 26. Inline testing may be performed utilizing an electrical testing apparatus including a probe card carrying multiple cantilevered probe needles (not shown). During inline testing, the probe needles are placed in contact with frontside bondpads 22 and 24 and electrical measurements are taken. To ensure adequate electrical contact, the probe needles are pressed against bondpads 22 and 24 with sufficient force to cause needle deflection. Scratching or gouging of bondpad 22 and/or 24 may thus result, especially when bondpads 22 and 24 are formed from a relatively soft metal, such as copper.

Figure 2:
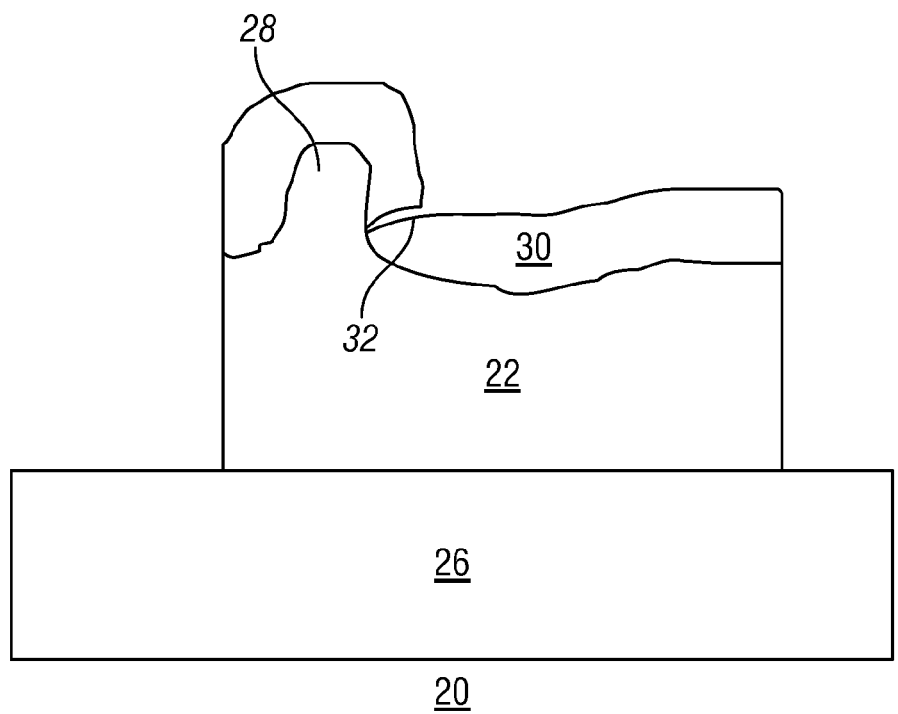
FIG. 2 is a simplified cross-sectional view of the integrated circuit after deposition of an interlayer dielectric material over the gouged frontside bondpad shown in FIG. 1 and the consequent formation of an ingress path through the interlayer dielectric material.

In the example illustrated in FIG. 1, inline testing of frontside bondpad 22 has resulted in the gouging of bondpad 22 and the consequent pile-up of bondpad material on the upper contact surface of bondpad 22 (indicated in FIG. 1 at 28). Gouging of bondpad 22, and the corresponding pile-up of bondpad material, can prevent the subsequently deposited interlayer dielectric from forming a complete seal over bondpad 22 and, more generally, over semiconductor substrate 20. This may be more fully appreciated by referring to FIG. 2, which illustrates semiconductor substrate 20 after the deposition of an interlayer dielectric ("ILD") 30 over frontside bondpad 22. As can be seen in FIG. 2, the portion of ILD 30 deposited over gouged bondpad 22 has failed to form a complete seal, and an ingress path 32 has been formed through ILD 30 to bondpad 22 (the water ingress path is also formed through a subsequently-deposited sealing layer, which is not shown in FIG. 2 and which normally prevents direct exposure of ILD 30 to water during processing). Ingress path 32 enables water to seep through ILD 30 and potentially diffuse significant distances within ILD 30, especially when ILD 30 is formed from an ultra low-k material having a relatively high porosity. As noted above, residual water can upset the etching process (e.g., reactive ion etching) utilized to pattern ILD 30. In addition, residual water can react with and oxidize the metal liner subsequently deposited over the sidewalls of the contact openings and trenches, thereby decreasing the effectiveness of the metal liner as a barrier to conductive (e.g., copper) plugs later formed within contact openings.

The following describes exemplary embodiments of an integrated circuit including a unique backside test structure that enables inline testing to be performed without usage of the frontside bondpads. As a result, scratching or gouging of the frontside bondpads is avoided, residual water is prevented from diffusing into the interlayer dielectric (e.g., ILD 30 shown in FIGS. 1 and 2) during back-end-of-the-line processing, and overall product yield is improved. As will be described more fully below, the backside test structure includes one or more probe pads formed over the backside of a semiconductor substrate and electrically coupled to one or more frontside bondpads utilizing at least one Through-Silicon-Via (TSV). Notably, TSVs have recently been identified as a convenient means for enabling high density three dimensional device packaging, such as wafer-to-wafer and die-to-wafer stacking, and for improving device performance by reducing propagation delays. The processes by which TSVs are formed through integrated circuits are thus likely to be incorporated into mainstream fabrication processes, in which case the formation of backside test structures and TSVs described below can be implemented with little additional cost to the circuit fabrication process.

Figure 3:
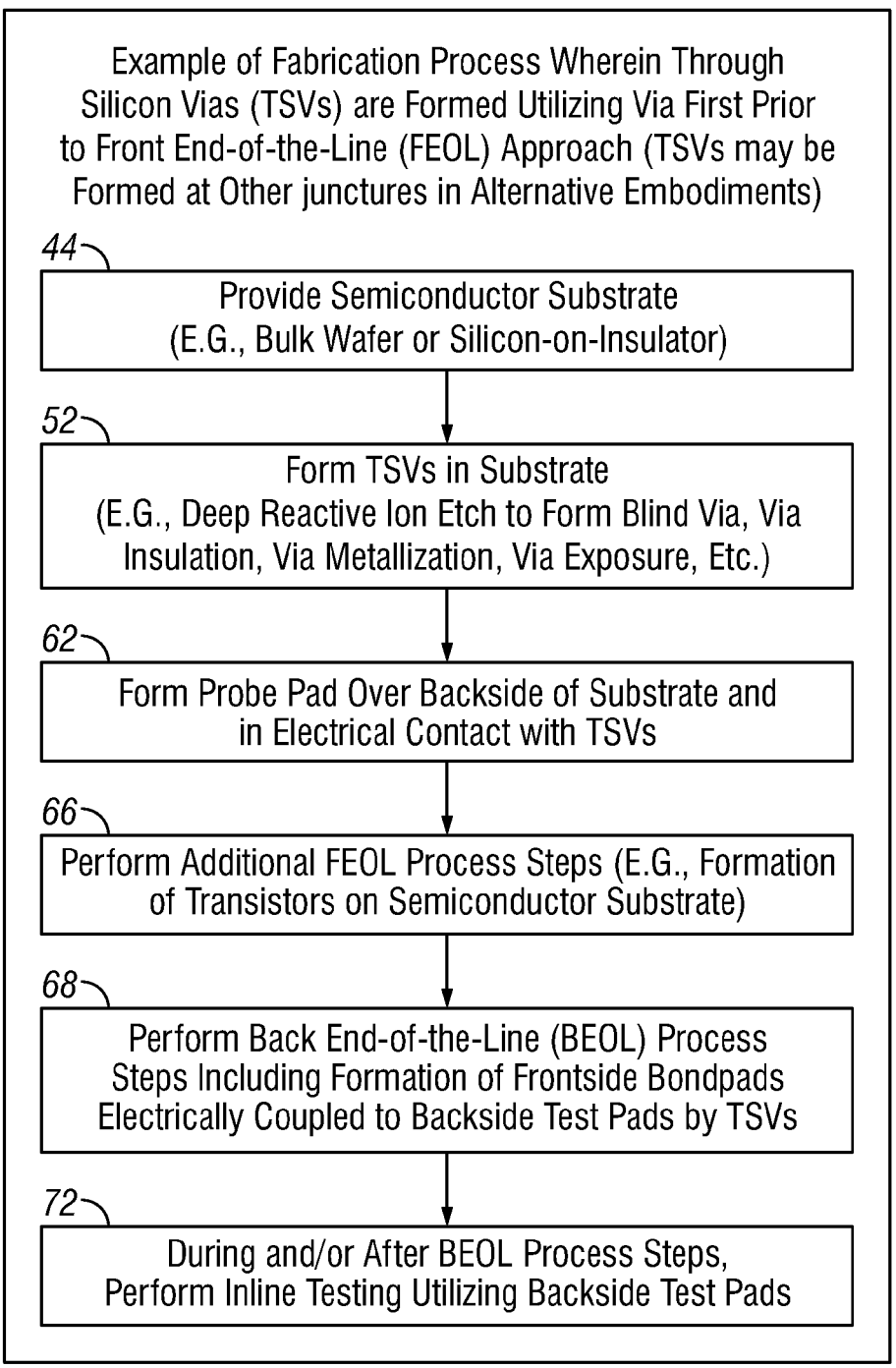
FIG. 3 is a flowchart illustrating a method for fabricating an integrated circuit having a backside test structure in accordance with an exemplary embodiment of the present invention.

Through-Silicon-Vias can be formed utilizing a variety of different approaches, which are conventionally known and which may be performed at various junctures throughout circuit fabrication processes. Useful approaches for forming TSVs include, but are not limited to, "Via First prior to Front-End-of-the-Line (FEOL)," "Via First after Back-End-of-the-Line (BEOL)," and "Via Last" approaches, all of which are well-documented in industry literature. It is, however, emphasized that the TSVs utilized to electrically couple the frontside bondpads to the backside probe pads can be formed utilizing any TSV formation technique, whether currently known or later developed. To provide one non-limiting example, an illustrative fabrication method is described below in conjunction with FIG. 3 wherein a plurality of Through-Silicon-Vias is formed utilizing a "Via First prior to FEOL" approach. A first exemplary integrated circuit that can be produced utilizing the exemplary fabrication method shown in FIG. 3 is also described below in conjunction with FIGS. 4-9, and a second exemplary integrated circuit that can be produced utilizing the exemplary fabrication method shown in FIG. 3 is further described below in conjunction with FIGS. 10-13. Various steps in the formation of Through-Silicon-Vias and, more generally, in the fabrication of integrated circuits are well-known within the semiconductor industry and will only be mentioned briefly herein or omitted entirely without providing the well-known process details.

Figure 4:
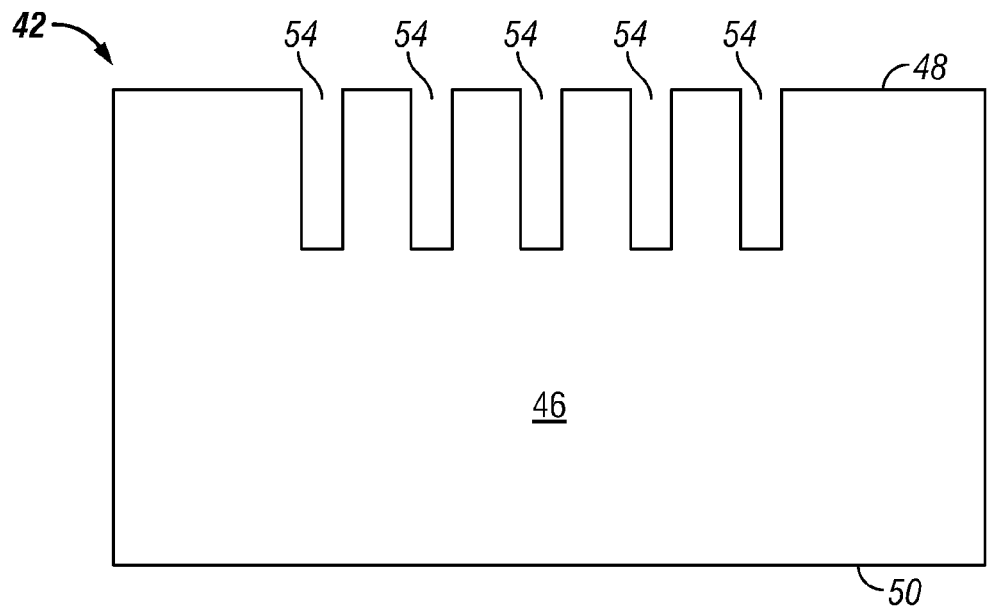
FIGS. 4-9 are simplified cross-sectional views of a first exemplary integrated circuit at various stages of manufacture and produced in accordance with the exemplary fabrication method shown in FIG. 3.

FIG. 3 is a flowchart illustrating an exemplary embodiment of a method 40 for fabricating an integrated circuit including a semiconductor substrate and a plurality of Through-Silicon-Vias (TSVs) formed through the substrate utilizing a "Via First prior to FEOL" approach. FIGS. 4-9 are simplified cross-sectional views of a first exemplary integrated circuit 42 at various stages of manufacture and produced in accordance with the exemplary fabrication method 40 shown in FIG. 3. At STEP 44 (FIG. 3), method 40 commences with the provision of a semiconductor substrate, such as a semiconductor substrate 46 of the type generically illustrated in FIG. 4 (only a portion of substrate 46 is shown in FIG. 4 for clarity). Semiconductor substrate 46 can be a bulk silicon wafer, a silicon-on-insulator (SOI) wafer, or any other substrate on which a plurality of semiconductor devices can be formed. Semiconductor substrate 46 includes an active surface or frontside 48, over which a plurality of semiconductor devices and frontside bondpads will ultimately be formed, and an opposing backside 50, over which one or more backside probe pads will be formed as described in detail below.

During STEP 52 of method 40 (FIG. 3), one or more Through-Silicon-Vias are formed through semiconductor substrate 46. As noted above, the Through-Silicon-Vias can be formed in a variety of different manners. In one exemplary approach, and with reference to FIG. 4, a number of blind vias 54 is first formed within semiconductor substrate 46. Blind vias 54 extend through frontside 48 and toward backside 50 of semiconductor substrate 46, but do not penetrate through backside 50 of substrate 46. In one embodiment wherein semiconductor substrate 46 is approximately 700 microns thick, blind vias 54 extend approximately 100 to approximately 200 microns into substrate 46. Blind vias 54 can be formed utilizing a number of conventionally-known processes, including laser drilling and anisotropic etching processes. In a preferred embodiment, blind vias 54 are formed utilizing photolithography and etching processes capable of producing vias having relatively high aspect ratios. As a specific example, blind vias 54 may be formed utilizing a deep reactive ion etching process, such as a two mode Bosch process. In the first mode of the Bosch process, an anisotropic plasma etch is performed utilizing a chemistry selective to semiconductor substrate 46; e.g., when substrate 46 comprises silicon, a sulfur hexafluoride chemistry ($SF_6$) is conveniently employed. In the second mode of the Bosch process, a chemically inert passivation layer is deposited over substrate 46 utilizing, for example, an octafluorobutene ($C_4F_8$) source gas. By continually alternating between the first mode and the second mode of the Bosch process, vias having nearly vertical sidewalls and relatively high aspect ratios (e.g., approaching, and possibly exceeding, approximately 30:1) can be formed in substrate 46.

As will become apparent in the course of the subsequent description, the location at which blind vias 54 are formed within substrate 46 will generally be determined by bondpad layout; i.e., the locations at which bondpads will ultimately be formed over frontside 48 of substrate 46. As noted above, and as will be described more fully below, vias 54 are utilized to electrically couple one or more frontside bondpads to one or more backside probe pads and thereby yield a backside test structure. In the illustrated example, multiple (e.g., five) blind vias 54 are formed within semiconductor substrate 46 and will ultimately couple a frontside bondpad to a corresponding backside probe pad. By utilizing multiple smaller vias (as opposed to a single larger via) to electrically connect a single frontside bondpad to a single backside probe pad, the subsequent filling of vias 54 with a conductive material can be facilitated (described below in conjunction with FIG. 6). At the same time, by utilizing multiple smaller vias (as opposed to a single smaller via) to electrically connect a frontside bondpad to a corresponding backside probe pad, electrical resistance can be minimized. The filling of vias 54 can also be facilitated by forming each via 54 to have an elongated or slot-like planform shape. In exemplary embodiment illustrated in FIG. 5, vias 54 are substantially evenly spaced; however, via-to-via spacing may vary in alternative embodiments, as may the geometry and dimensions of vias 54.

Figure 5:
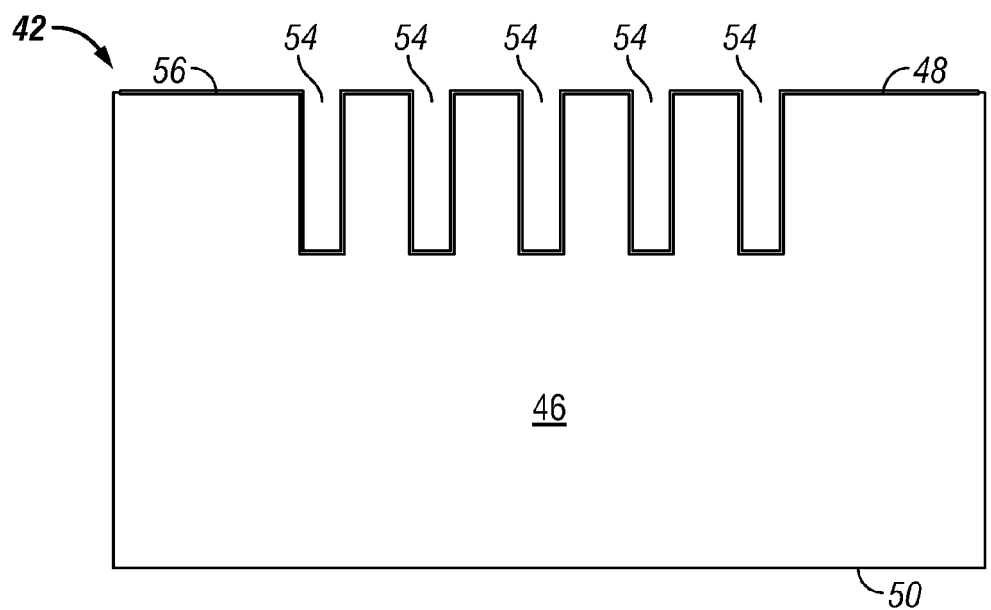

After the formation of blind vias 54, one or more additional layers of material may be deposited over semiconductor substrate 46. For example, as illustrated in FIG. 5, a dielectric layer 56 can be conformally deposited over frontside 48 of substrate 46, including the surfaces of substrate 46 defining blind vias 54. Dielectric layer 56 can comprise, for example, silicon dioxide deposited over substrate 46 utilizing a chemical vapor deposition (CVD) technique, such as low temperature Plasma-Enhanced CVD or Low Pressure CVD performed utilizing silane ($SiH_4$) or tetraethylorthosilicate ($Si(OC_2H_5)_4$ or "TEOS") chemistries. Although not shown in FIG. 5 for clarity, a barrier layer (e.g., tantalum nitride) and/or a seed layer (e.g., copper) may be subsequently deposited over dielectric layer 56 utilizing, for example, a conventionally-known physical or chemical vapor deposition technique.

Figure 6:
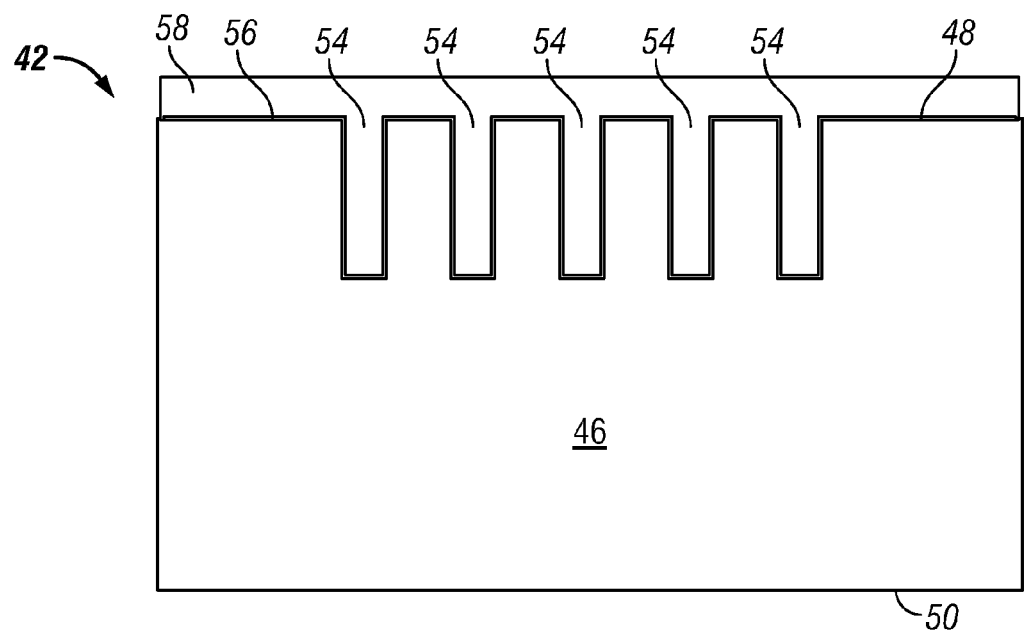

Next, as part of STEP 52 of fabrication method 40 (FIG. 3), a conductive material 58 is deposited over semiconductor substrate 46 and into blind vias 54 (commonly referred to as "via fill" or "via metallization"). FIG. 6 illustrates partially completed integrated circuit 42 after via fill. The material selected for conductive material 58, and the manner in which conductive material 58 is deposited over semiconductor substrate 46, may be chosen, at least in part, based upon the aspect ratio of blind vias 54. A non-exhaustive list of materials suitable for usage as conductive material 58 includes copper and tungsten. In a preferred embodiment, conductive material 58 comprises tungsten deposited over substrate 46 and into blind vias 54 utilizing a CVD or a metal plating process. After deposition of material 58, excess conductive material 58 may be removed from frontside 48 of semiconductor substrate 46 utilizing, for example, a chemical mechanical planarization ("CMP") process.

Figure 7:
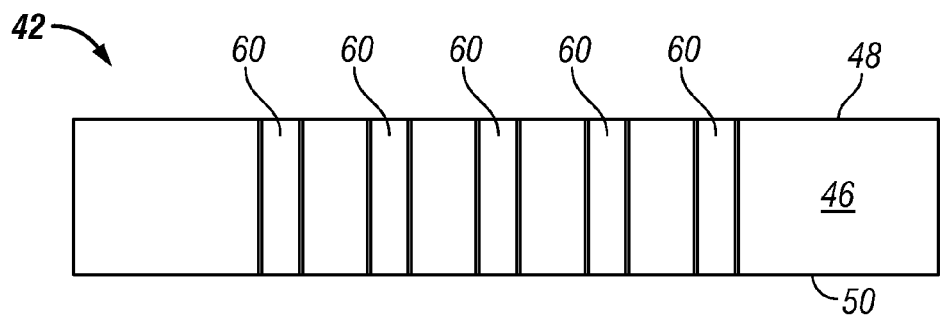

Continuing with STEP 52 of exemplary method 40 (FIG. 3), semiconductor substrate 46 is subjected to a thinning process wherein material is removed from backside 50 of substrate 46 to expose blind vias 54 therethrough (STEP 52, FIG. 3). Thinning of backside 50 and exposure of blind vias 54 (FIGS. 4-6) can be accomplished by first bonding frontside 48 of semiconductor substrate 46 to a carrier, such as a glass carrier (not shown), and subsequently removing material from backside 50 of substrate 46 utilizing, for example, one or more grinding, lapping, or polishing steps. Alternatively, a carrier can be bonded to backside 50 of substrate 46 having windows therethrough that allow the formation and testing of the later-formed backside probe pads, such as backside probe pad 64 described below in conjunction with FIGS. 8 and 9. FIG. 7 illustrates semiconductor substrate 46 after thinning of backside 50. The vias formed in substrate 46 now extend from frontside 48, through semiconductor substrate 46, and to backside 50; consequently, the vias formed in substrate 46 are identified in FIG. 7 by a new reference numeral (i.e., reference numeral 60) and are referred to hereafter as "Through-Silicon-Vias 60" or, more simply, "TSVs 60." The foregoing notwithstanding, wafer thinning and carrier bonding may be not be performed until the completion of BEOL processing in alternative embodiments of method 40.

Figure 8:
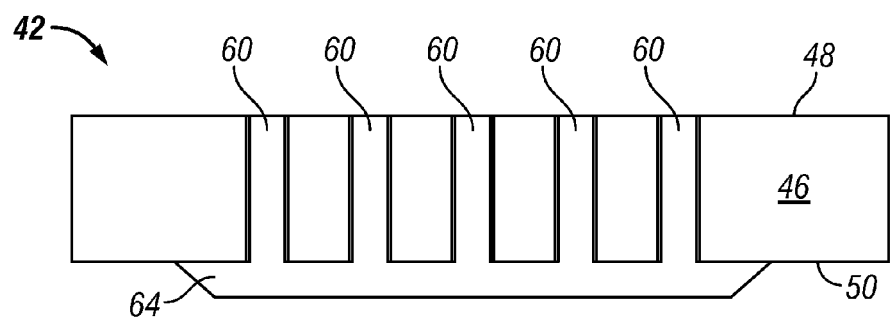

After the formation of TSVs 60 through semiconductor substrate 46 (STEP 52, FIG. 3), one or more probe pads are formed over backside 50 of semiconductor substrate 20 (STEP 62, FIG. 3). FIG. 8 illustrates partially completed integrated circuit 42 after the formation of a backside probe pad 64 over backside 50 of semiconductor substrate 46. Backside probe pad 64 is formed over, and in electrical contact with, TSVs 60. Backside probe pad 64 may be formed utilizing any one of a number of etching and deposition processes conventionally utilized in the formation of frontside bondpads, including damascene and dual damascene techniques.

In a preferred embodiment, backside probe pad 64 comprises a metal having a hardness greater than that of copper, such as nickel, tungsten, cobalt, molybdenum, or tantalum; and, in a more preferred embodiment, backside probe pad 64 comprises either nickel or tungsten. In one specific implementation, backside probe pad 64 is formed via the chemical vapor deposition of tungsten. By forming backside probe pad 64 from a metal having a hardness greater than that of copper, backside probe pad 64 may be better able to withstand multiple touch down events or "probings" without scratching or gouging, as described more fully below.

After the formation of probe pad 64 over backside 50 of semiconductor substrate 46 (STEP 62, FIG. 3), additional steps are performed to complete FEOL processing (STEP 66, FIG. 3). In particular, during FEOL processing, a plurality of semiconductor devices (e.g., transistors, resistors, capacitors, and the like) is formed over frontside 48 of semiconductor substrate 46 (not shown in FIGS. 4-7 for clarity). BEOL processing of partially-completed integrated circuit 42 is then performed (STEP 68, FIG. 3); e.g., a plurality of BEOL layers is formed overlaying substrate 46 and the devices formed thereon utilizing, for example, a damascene or a dual damascene technique. For example, during a generalized damascene process utilized to form the $M_1$ metal level, an intermetal dielectric material ("IMD") is first deposited over a previously deposited pre-metal dielectric layer; the IMD is etched to create a pattern therein; the pattern is filled with a conductive metal, such as copper; the excess copper is removed utilizing a CMP process to yield a number of metal interconnect lines within the IMD; and an additional IMD (commonly referred as a "capping layer") is deposited over the patterned interconnect lines and previously-deposited IMD. Additional metal levels (e.g., the $M_2$ metal level, the $M_3$ metal level, etc.) are successively formed in a similar manner.

Figure 9:
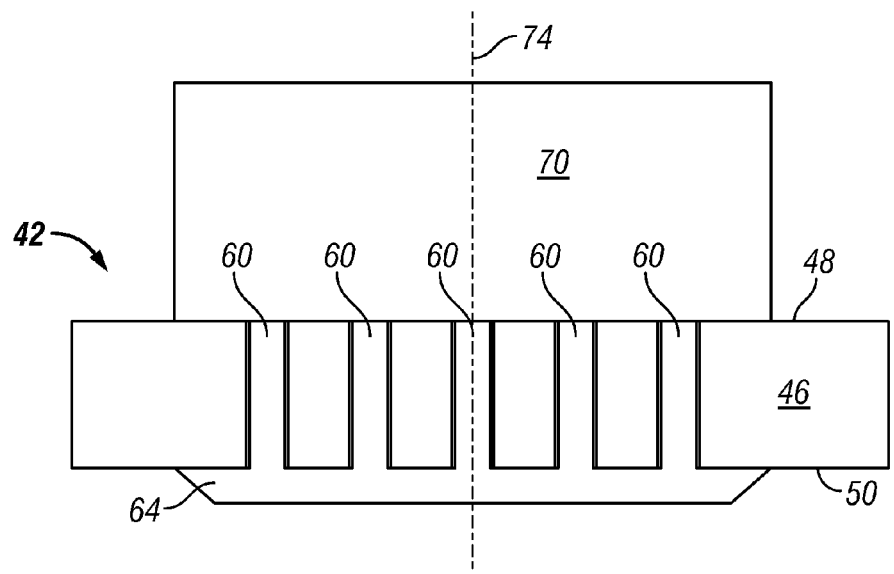

During BEOL processing, frontside bondpads are formed in some, and commonly all, of the metallization layers. Frontside bondpads can be formed utilizing a damascene process of the type described above. In accordance with embodiments of the fabrication method, and as indicated in FIG. 3 at STEP 68, the frontside bondpads are formed in electrical or ohmic contact with the Through-Silicon-Vias created during STEP 52 of method 40 (FIG. 3) and, therefore, in electric communication with the backside probe pads created during STEP 62 of method 40 (FIG. 3). FIG. 9 illustrates a frontside bondpad 70 formed during STEP 68 of method 40 (FIG. 3) over frontside 48 of semiconductor substrate 46. As can be seen in FIG. 9, frontside bondpad 70 is formed in electrical contact with TSVs 60, which electrically couple frontside bondpad 70 to backside probe pad 64. In a preferred embodiment, frontside bondpad 70 is formed at a location substantially aligned with backside probe pad 64, as taken along an axis substantially orthogonal to a major frontside surface and/or to a major backside surface of semiconductor substrate 46 (represented in FIG. 9 by dashed line 74). As indicated above, the term "bondpad" is utilized to accord with common industry terminology and does not indicate that the bondpad (e.g., bondpad 70) will be bonded to any other structure.

To complete exemplary fabrication method 40 (STEP 72, FIG. 3), inline testing of integrated circuit 42 is performed utilizing the backside probe pads (e.g., backside probe pad 64 shown in FIG. 9) formed during STEP 62 (FIG. 3). Inline testing can be performed utilizing conventional testing equipment of the type described above and can be carried-out utilizing procedures similar to those conventionally employed. However, in contrast to conventional inline testing procedures, it is the backside probe pads (e.g., backside probe pad 64 shown in FIG. 9), and not the frontside bondpads (e.g., frontside bondpad 70 shown in FIG. 9), that serve as contact points for the probe needles. Testing of the backside probe pads can be performed as frequently as desired; e.g., as indicated in FIG. 3 at STEP 72, backside probe pads may be tested at various junctures throughout BEOL processing and/or after BEOL processing is completed. By forming one or more dedicated probe pads over the backside of the semiconductor substrate, which can be repeatedly utilized for inline testing at chosen intervals throughout the fabrication process, inline testing of the frontside bondpads can be rendered unnecessary thereby avoiding potential gouging of the frontside bondpads and the formation of water ingress paths through the interlayer dielectric and any overlying sealing layers. As indicated above, it may be desirable to form the backside probe pads from a metal having a hardness greater than copper (e.g., tungsten) when the backside probe pads are to be subject to multiple probings to decrease the likelihood of probe pad gouging; however, even if gouging of one or more backside probe pads should occur, probe pad gouging will not interfere with the sealing characteristics of the intermetal dielectric deposited during BEOL processing, and thus will not result in the formation of ingress paths through the intermetal dielectric, in view of the location of the backside probe pad or pads.

Figure 10:
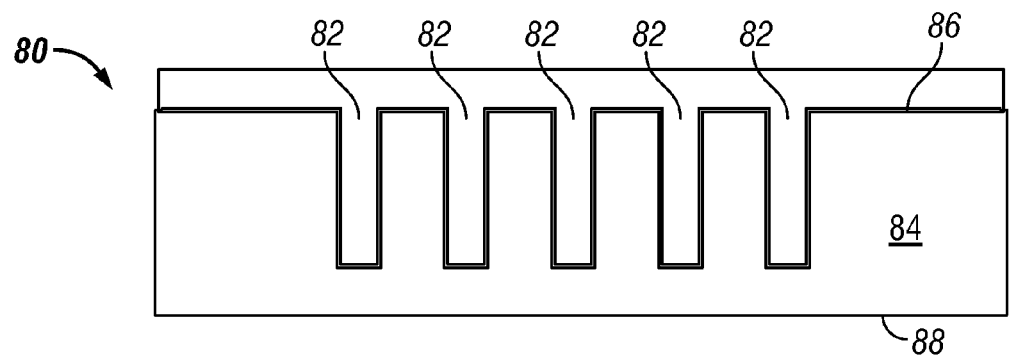
FIGS. 10-12 are simplified cross-sectional views of a second exemplary integrated circuit at various stages of manufacture and produced in accordance with the exemplary fabrication method shown in FIG. 3.
Figure 11:
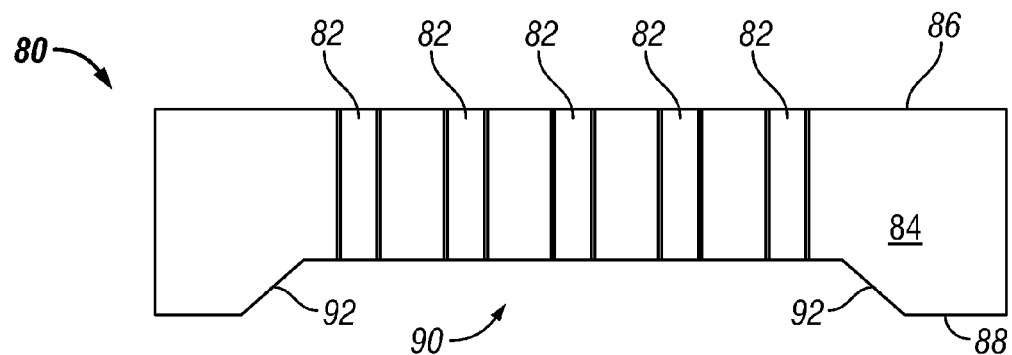
Figure 12:
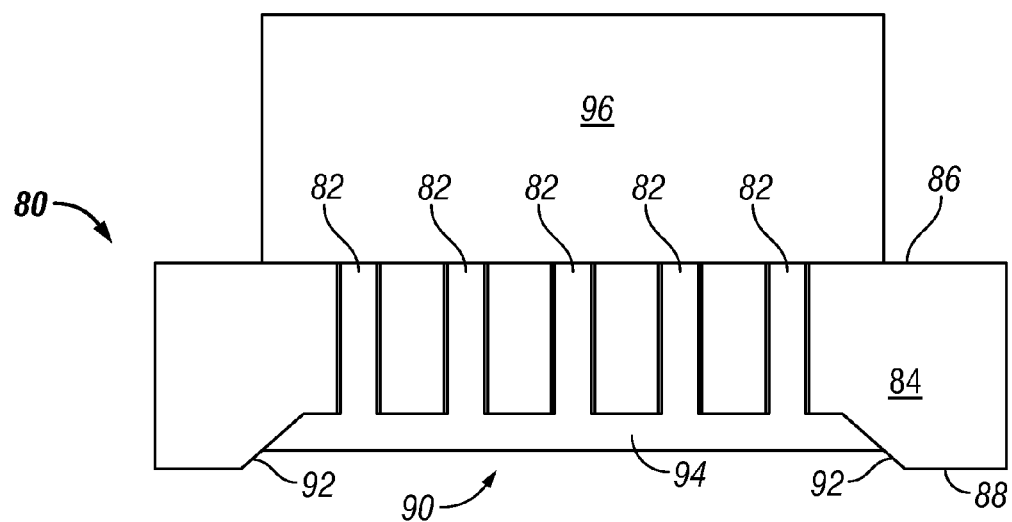

The foregoing has thus described a first exemplary integrated circuit 42 (FIGS. 4-9) that can be produced in accordance with exemplary fabrication method 40 (FIG. 3) and that has a backside test structure including at least one dedicated backside probe pad 64 (FIGS. 8 and 9). While, in the above-described example, probe pad 64 protruded from backside 50 of semiconductor substrate 46, it may be desirable to form one or more backside probe pads that are recessed into backside 50 of semiconductor substrate 46 to protect the probe pads during workpiece handling (e.g., carrier bonding), to avoid contamination of tool chucks, and/or to avoid sticking of the backside probe pads to tool chucks. Further emphasizing this point, FIGS. 10-12 are simplified cross-sectional views of a second exemplary integrated circuit 80 at various stages of manufacture and produced in accordance with the exemplary fabrication method shown in FIG. 3. Referring initially to FIG. 10, integrated circuit 80 is substantially identical to integrated circuit 42 at the stage of manufacture illustrated in FIG. 7; e.g., integrated circuit 80 includes a plurality (e.g., five) vias 82 formed in a semiconductor substrate 84 having a frontside 86 and an opposing backside 88. However, in contrast to integrated circuit 42 (FIG. 7), thinning of integrated circuit 80 was halted after removal of a predetermined thickness of material from backside 88 of integrated circuit 80 and prior to the exposure of vias 82. Thus, at the stage of manufacture shown in FIG. 10, vias 82 are still properly referred to as "blind vias." The foregoing example notwithstanding, in further embodiments of fabrication method 40, semiconductor substrate 46 may not be subjected to global thinning during STEP 52 (FIG. 3); instead, localized thinning can be performed wherein only selected portions of backside 88 of semiconductor substrate 46 are effectively thinned via the formation of localized trenches or recesses, such as recess 90 described below in conjunction with FIG. 11.

With reference to FIG. 11, a trench or recess 90 is next formed in backside 88 of semiconductor substrate 84 to expose vias 82. Recess 90 can be formed utilizing any one of a number of known lithographic etching processes. In one example, an etch mask (e.g., silicon nitride) is first formed over backside 88 of substrate 84, lithography is utilized to create an opening through the etch mask, wet or dry etching is performed to remove the portion of substrate 84 overlying vias 82, and the etch mask is removed. In a preferred embodiment, recess 90 is formed utilizing an etching process selective to a particular crystal plane or planes (commonly referred to as a "preferential crystallographic etchant") to impart recess 90 with truncated pyramidic shape including angled or slanted sidewalls 92. By imparting recess 90 with slanted sidewalls 92, sharp corners are avoided that are prone to chipping or other damage during probing. In one embodiment, a wet potassium hydroxide (KOH) etch is utilized to impart recess 90 with sidewalls 92 forming an angle of approximately 45 degrees with the major backside surface of semiconductor substrate 84. After the formation of recess 90, a backside probe pad 94 is formed within recess 90 in the above-described manner (e.g., by way of the deposition of a metal, such as nickel, tungsten, cobalt, molybdenum, or tantalum). In a preferred embodiment, and as generally indicated in FIG. 12, probe pad 94 is formed within recess 90 to be depressed or sunken relative to the major backside surface of substrate 84. STEPS 66, 68, and 72 of method 40 (FIG. 3) are then performed, including the formation of a frontside bondpad 96 overlaying frontside 86 of substrate 84 (FIG. 12), to complete fabrication of integrated circuit 80.

It should thus be provided that there has been provided an exemplary embodiment of a method for fabricating an integrated circuit including a backside test structure (i.e., one or more backside probe pads electrically coupled to one or more frontside bondpads by way of at least one Through-Silicon-Via), which renders unnecessary the direct inline testing of the frontside bondpads and, in so doing, eliminates the likelihood of bondpad gouging and the consequent formation of water ingress paths through the intermetal dielectric and any overlying sealing layers depositing during BEOL processing. Notably, the exemplary embodiment of the fabrication method described above is compatible with ULK dielectrics and minimize production costs by utilizing fabrication techniques already incorporated or likely to be incorporated into mainstream circuit production in the near future, namely, the formation of a plurality of Through-Silicon-Vias in the semiconductor substrate. The foregoing has also provided embodiments of an integrated circuit produced in accordance with the above-described exemplary circuit fabrication method.

While at least one exemplary embodiment has been presented in the foregoing Detailed Description, it should be appreciated that a vast number of variations exist. It should also be appreciated that the exemplary embodiment or exemplary embodiments are only examples, and are not intended to limit the scope, applicability, or configuration of the invention in any way. Rather, the foregoing Detailed Description will provide those skilled in the art with a convenient road map for implementing the exemplary embodiment or exemplary embodiments. It should be understood that various changes can be made in the function and arrangement of elements without departing from the scope of the invention as set forth in the appended Claims and the legal equivalents thereof.

What is claimed is:

1. A method for fabricating an integrated circuit, the method comprising the steps of:
   providing a semiconductor substrate having a frontside and a backside;
   forming semiconductor devices on the frontside of the semiconductor substrate;
   forming at least one blind via extending into the frontside and terminating in the semiconductor substrate;
   thinning the semiconductor substrate to reposition the backside, wherein the repositioned backside intersects the at least one blind via to form at least one Through-Silicon-Via (TSV) through the semiconductor substrate;
   forming a recess in the repositioned backside of the semiconductor substrate adjacent the at least one TSV;
   forming a backside probe pad over the backside of the semiconductor substrate and electrically coupled to the at least one TSV; and
   forming a frontside bondpad over the frontside of the semiconductor substrate and electrically coupled to the backside probe pad by the at least one TSV.

2. A method according to claim 1 wherein the step of forming a backside probe pad comprises forming the backside probe pad over and in electrical contact with the at least one TSV.

3. A method according to claim 1 wherein the step of forming a backside probe pad comprises depositing an electrically conductive material over the backside of the semiconductor substrate having a hardness greater than that of copper.

4. A method according to claim 3 wherein the step of depositing comprises depositing a metal selected from the group consisting of nickel, tungsten, cobalt, molybdenum, and tantalum.

5. A method according to claim 1 wherein the at least one blind via is at least as long as the at least one TSV.

6. A method according to claim 1 wherein the step of forming a backside probe pad comprises forming the backside probe pad at a location substantially aligned with the frontside bondpad, as taken along an axis substantially orthogonal to a major frontside surface of the semiconductor substrate.

7. A method according to claim 1 wherein the step of thinning the semiconductor substrate to reposition the backside forms a plurality of TSVs through the semiconductor substrate and extending from the frontside bondpad to the backside probe pad.

8. A method according to claim 1 wherein the step of forming a backside probe pad comprises forming a backside probe pad completely within the recess.

9. A method according to claim 1 wherein the step of forming a recess in the repositioned backside of the semiconductor substrate comprises exposing a portion of the repositioned backside of the semiconductor substrate to an etchant having a crystal plane selective chemistry.

10. A method according to claim 9 wherein the step of exposing comprises exposing a portion of the repositioned backside of the semiconductor substrate to an etchant having a potassium hydroxide chemistry.

11. A method for fabricating an integrated circuit having a backside test structure, the method comprising the steps of:
    providing a semiconductor substrate having a frontside and a backside;
    forming a plurality of blind vias extending from the frontside and terminating in the semiconductor substrate;
    removing a portion of the semiconductor substrate to expose the plurality of blind vias and form a plurality of Through-Silicon-Vias (TSVs) extending from the frontside to the backside of the semiconductor substrate, wherein each blind via is at least as long as each TSV, wherein removing the portion of the semiconductor substrate comprises thinning the semiconductor substrate to reposition the backside, and wherein the repositioned backside intersects the plurality of blind vias to form the plurality of TSVs extending from the frontside to the repositioned backside of the semiconductor substrate;
    etching a recess in the repositioned backside of the semiconductor substrate adjacent the plurality of TSVs therethrough;

forming a backside probe pad over the backside of the semiconductor substrate and in electrical contact with the plurality of TSVs; and forming a frontside bondpad over the frontside of the semiconductor substrate and electrically coupled to the backside probe pad by the plurality of TSVs.

12. A method according to claim 11 wherein the step of etching comprises subjecting the portion of the repositioned backside of the semiconductor substrate adjacent the plurality of TSVs to an etchant having a crystal plane selective chemistry.

13. A method according to claim 11 wherein the step of forming the backside probe pad comprises depositing a metal into the recess to form the backside probe pad completely within the recess.

14. A method according to claim 13 wherein the metal is selected from the group consisting of nickel and tungsten.

15. An integrated circuit, comprising:
a semiconductor substrate having a frontside and a backside, wherein the substrate is formed with a recess in the backside;
a backside probe pad formed completely within the recess in the backside such that the recess is deeper than the backside probe pad;
a frontside bondpad formed over the frontside of the semiconductor substrate; and
at least one Through-Silicon-Via (TSV) extending through the semiconductor substrate and electrically coupling the backside probe pad to the frontside bondpad; and
semiconductor devices formed on the frontside of the semiconductor substrate.

16. An integrated circuit according to claim 15 wherein the backside probe pad is substantially aligned with frontside bondpad, as taken along an axis substantially orthogonal to a major backside surface of the integrated circuit, and wherein the at least one TSV extends from the frontside bondpad, through the semiconductor substrate, and to the backside probe pad.

* * * * *